United States Patent
Summerfelt et al.

(10) Patent No.: US 6,432,473 B1
(45) Date of Patent: Aug. 13, 2002

(54) PB SUBSTITUTED PEROVSKITES FOR THIN FILMS DIELECTRICS

(75) Inventors: Scott R. Summerfelt, Dallas; Howard R. Beratan, Richardson, both of TX (US); Bernard M. Kulwicki, N. Attleboro, MA (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/458,999

(22) Filed: Jun. 1, 1995

Related U.S. Application Data

(63) Continuation of application No. 08/304,622, filed on Sep. 12, 1994, now abandoned, which is a continuation of application No. 08/173,815, filed on Dec. 23, 1993, now abandoned, which is a continuation of application No. 07/891,508, filed on May 29, 1992, now abandoned.

(51) Int. Cl.[7] ................................................ B05D 5/12
(52) U.S. Cl. .................. 427/100; 427/126.3; 427/376.2
(58) Field of Search ............................. 427/100, 126.3, 427/376.2; 501/136, 137, 138, 139

(56) References Cited

U.S. PATENT DOCUMENTS

| | | | | |
|---|---|---|---|---|
| 3,859,403 A | * | 1/1975 | Kahn | ........................ 264/56 |
| 4,808,463 A | * | 2/1989 | Yoshikatsu et al. | ......... 428/215 |
| 5,258,338 A | * | 11/1993 | Manor | ........................ 501/137 |

FOREIGN PATENT DOCUMENTS

| | | | | |
|---|---|---|---|---|
| DE | 3924803 | | 2/1990 | ........... C04B/35/40 |
| EP | 0257653 | * | 3/1988 | ........... C04B/35/46 |
| EP | 0380326 | | 8/1990 | ............ H01G/7/06 |

OTHER PUBLICATIONS

M. Grant Norton, Kathryn P. B. Cracknell and C. Barry Carter, "Pulsed–Lasar Deposition of Barium Titanate Thin Films," J. Am. Ceram. Soc. 75 (7) 1999–2002 (1992).

U. Syamaprasad, R. K. Galgali and B. C. Mohanty, "A Modified Barium Titanate for Capacitors," J. Am. Ceram. Soc. 70 (7) C–147 to C–148 (1987).

C. V. R. Vasant Kumar, R. Pascual and M. Sayer, "Crystallization of Sputtered Lead Zirconate Titanate Films by Rapid Thermal Processing," J. Appl. Phys. 71 (2), Jan. 1992.

Eun–Dong Kim, Yoo–Eup Hyung, and Mun–Soo Yun, "$PbZrO_3$–Doped (Ba,Sr) $TiO_3$–Based Dielectrics for High Voltage Capacitor Applications," Ceramic Bulletin, vol. 70, No. 11, 1991, pp. 1783–1787.

(List continued on next page.)

*Primary Examiner*—Benajamin L. Utech
(74) *Attorney, Agent, or Firm*—Jacqueline J. Garner; W. James Brady, III; Frederick J. Telecky, Jr.

(57) ABSTRACT

The invention described is a method of forming an improved dielectric material by adding lead to an original perovskite material having an original critical grain size to form a lead enhanced perovskite material, then forming a layer of the lead enhanced perovskite material having an average grain size less than the original critical grain size whereby the dielectric constant of the layer is substantially greater than the dielectric constant of the original perovskite material with an average grain size similar to the average grain size of the layer. The critical grain size, as used herein, means the largest grain size such that the dielectric constant starts to rapidly decrease with decreasing grain sizes. Preferably, the lead enhanced perovskite material is further doped with one or more acceptor dopants whereby the resistivity is substantially increased and/or the loss tangent is substantially decreased. Preferably, the original perovskite material has a chemical composition $ABO_3$, where A is one or more monovalent, divalent or trivalent elements, and B is one or more pentavalent, tetravalent, trivalent or divalent elements.

4 Claims, 2 Drawing Sheets

OTHER PUBLICATIONS

G. R. Love "Energy Storage in Ceramic Dielectrics," J. Am. Ceram. Soc. 73(2) 323–328, 1990.

W. B. Pennebaker "RF Sputtered Strontium Titanate Films," IBM Res. Develop., Nov. 1969, pp. 687–695.

G. Arlt, D. Hennings, G. de With, "Dielectric Properties of Fine–Grained Barium Titanate Ceramics," J. Appl. Phys., vol. 58, No. 4, Aug. 15, 1985, pp. 1619–1624.

K. Kinoshita and Akihiko Yamaji, "Grain–Size Effects on Dielectric Properties in Barium Titanate Ceramics," J. Appl. Phys., vol. 47, No. 1, Jan. 1976, pp. 371–373.

A. Yamaji, Y. Enomoto, K. Kinoshita and T. Murakami, Preparation, Characterization, and Properties of Dy–Doped Small–Grained $BaTiO_3$ Ceramics, J. Am. Ceramic Society, vol. 60, No. 3–4, Mar.–Apr. 1977, pp. 97–101.

Y. Enomoto and A. Yamaji, "Preparation of Uniformly Small–Grained $BaTiO_3$," Ceramic Bulletin, vol. 60, No. 5, 1981, pp. 566–570.

T. Murakami and A. Yamaji, "Dy–Doped $BaTiO_3$ Ceramics for High Voltage Capacitor Use," Ceramic Bulletin, vol. 55, No. 6, 1976, pp. 572–575.

F. Jona and G. Shirane, *Ferroelectric Crystals,* Chapter 5, The Macmillan Company, New York, 1962.

F. A. Kroger, *"The Chemistry of Imperfect Crystals,"* North–Holland Publishing Coompany—Amsterdam, 1964, pp. 198–201.

R. W. G. Wyckoff, *"Crystal Structures,"* Interscience Publishers, vol. 2, 1964, pp. 359–421.

S. Yamamichi, T. Sakuma, K. Takemura and Y. Miyasaka, "$SrTiO_3$ Thin Film Preparation by Ion Beam Sputtering and Its Dielectric Properties," Jpn. Journal Applied Physics, vol. 30 (1991), pp. 2193–2196.

Y. Miyasaka and S. Matsubara, "Dielectric Properties of Sputter–Deposited $BaTiO_3$–$SrTiO_3$ Thin Films," IEEE 7th Int. Symp. on Appl. of Ferroelectrics, (1991) pp. 121–124.

K. Koyama, T. Sakuma, S. Yamamichi, H. Watanabe, H. Aoki. S. Ohya, Y. Miyasaka and T. Kikkawa, "A Stacked Capacitor with $(Ba_xSr_{1-x})TiO_3$ for 256M DRAM," IEDM–91, 823–826 (1991).

P. C. Osbond, N. I. Payne, N. M. Shorrocks, R. W. Whatmore and F. W. Ainer, "Dielectric and Microstructure Properties of Barium Strontium Titanate Ceramics Prepared from Citrate Precursors," IEEE, CH2358, pp. 348–351 (1986).

S. D. Bernstein, Y. Kisler, J. M. Wahl, S. E. Bernacki and S. R. Collins, "Effects of Stoichiometry on PZT Thin Film Capacitor Properties," Mat. Res. Soc. Symp. Proc. [Symposium on Thin Film Ferroelectrics II] 1991).

S. Hsu and I. H. Kalish, "Ferrelectrics for Silicon VLSI," Proc. 3rd Inter. Symp. Integrated Ferroelectrics, 475–491 (1991) 1976, pp. 572–575.

B. M. Kulwicki and A. Amin, "Pyroelectric Imaging," To be presented at the 1992 Int'l Symposium on Applications of Ferroelectrics.

\* cited by examiner

PB SUBSTITUTED PEROVSKITES FOR THIN FILMS DIELECTRICS

CROSS-REFERENCES TO RELATED APPLICATIONS

This application is a Continuation of application Ser. No. 08/304,622 filed Sep. 12, 1994 abandoned, which is a Continuation of Ser. No. 08/173,815, filed Dec. 23, 1993 abandoned, which is a continuation of Ser. No. 07/891,508, filed May 29, 1992 abandoned.

The following related applications were filed concurrently with the instant application:

| Title | Inventors | Docket/Ser. No. |
|---|---|---|
| Fine Grain Pyroelectric Detector Material and Method now U.S. Pat. No. 5314651 | Kulwicki | 07/890,891 |
| Donor Doped Perovskites for Thin Film Dielectrics U.S. patent application Ser. No. 07/891,560, now abandoned | Summerfelt, Beratan, Kulwicki | 07/891,560 |

FIELD OF THE INVENTION

This invention generally relates to the fabrication of thin film capacitors such as those in dynamic random access memory devices.

BACKGROUND OF THE INVENTION

Without limiting the scope of the invention, its background is described in connection with current methods of forming thin film capacitors, as an example.

Heretofore, in this field, thin film capacitors such as those in DRAMs have used $SiO_2$ or $Si_3N_4$ as the dielectric material. As the destiny of intergrated circuits (number of devices per square centimeter) increases, the capacitors which store electrical charge in each DRAM memory device must decrease in size while maintaining approximately the same capacitance. Referring to the following equation, C is the capacitance of a planar capacitor, $\epsilon$ is the dielectric constant, $\epsilon_0$ is the dielectric permittivity of free space, A is the area, and d is the thickness of the dielectric.

$$C = \frac{\epsilon \epsilon_0 A}{d}$$

It is seen that the capacitance is directly proportional to the dielectric constant and inversely proportional to the thickness. Therefore, to build smaller capacitors while maintaining the same capacitance, one must increase $\epsilon$ and/or decrease the dielectric thickness.

One method of allowing a decrease in capacitor area is to make use of materials with a much higher dielectric constant than $SiO_2$ or $Si_3N_4$. The dielectric constant for both of these materials is less than ten. An important class of high dielectric constant materials is the perovskites (e.g. $BaTiO_3$ and $SrTiO_3$). The dielectric constants of these materials may be as high as 10,000 when they are fabricated as bulk ceramics. To be useful in the manufacture of miniature capacitors, these materials must be formed in thin films in a way that preserves their high dielectric constants relative to that of $SiO_2$.

SUMMARY OF THE INVENTION

This invention is a method for increasing the dielectric constant of perovskite materials. The perovskite materials are: (1) any material exhibiting the well known perovskite crystal structure, typified by $CaTiO_3$; and (2) compounds with structures which can be derived from the ideal cubic perovskite structure by way of small lattice distortions or omission of some atoms. Many perovskites have the chemical formula $ABO_3$, where A is one or more monovalent, divalent or trivalent elements and B is one or more pentavalent, tetravalent, trivalent or divalent elements.

It has been discovered that current methods of forming thin films of perovskite materials generally do not preserve the beneficial properties that these materials exhibit in bulk ceramic form. In particular, the dielectric constants of current thin films of these materials do not approach those of perovskite materials fabricated as bulk ceramics. In addition, if these materials are to be used in the thin film capacitors which make up memory devices, they must also exhibit small leakage current at high electric fields and have small loss tangents. The electrical, chemical, and mechanical properties must be fairly uniform over the operating temperature range of the device.

Preserving the high dielectric constants exhibited by the bulk ceramic forms of perovskite materials in thin film form is difficult. It has been discovered that the dielectric constant of these materials generally decreases with decreasing grain size. The grain size in bulk ceramics is generally 1 to 20 micrometers ($\mu$m) while the grain size in a thin film is usually similar to the film thickness, generally 0.02 to 0.20 $\mu$m. For example, the range of dielectric constants observed in bulk ceramic barium titanate ($BaTiO_3$, hereafter referred to as BT) or barium strontium titanate (($Ba,Sr)TiO_3$, hereafter referred to as BST) is generally 1000 to 20,000 while the range of dielectric constants observed in thin films of these materials is only 100 to 600.

Much of the past research in this area has endeavored to preserve the high dielectric constant of perovskites such as BT and BST in thin film form. It is known that depositing thin films in a way that maximizes the grain size in the film serves to maximize the dielectric constant. This can be done by keeping the temperature of the substrate onto which the perovskite film is deposited at a high temperature, because higher deposition temperatures usually produce larger grain sizes in the deposited film. Higher substrate temperatures, however, may cause damage to existing devices and structures already formed on the substrate. Generally, temperatures should be kept as low as possible. Current methods of depositing thin film perovskites with high dielectric constants are thus limited by the film thickness and the potential damage caused by elevating the substrate to high temperatures.

The invention described is a method of forming an improved dielectric material by adding lead to an original perovskite material having an original critical grain size to form a lead enhanced perovskite material, then forming a layer of the lead enhanced perovskite material having an average grain size less than the original critical grain size whereby the dielectric constant of the layer is substantially greater than the dielectric constant of the original perovskite material with an average grain size similar to the average grain size of the layer. The average grain size of the layer so produced may be, for example, one-half or one-fourth of the original critical grain size. The critical grain size, as used herein, means the largest grain size such that the dielectric constant decreases with decreasing grain sizes when measured at the intended operating temperature. Preferably, the lead enhanced perovskite material is further doped with one or more acceptor dopants whereby the resistivity is substantially increased and/or the loss tangent is substantially decreased. Preferably, the original perovskite material has a chemical composition $ABO_3$, where A is one or more monovalent, divalent or trivalent elements, and B is one or more pentavalent, tetravalent, trivalent or divalent elements.

Structures containing this improved dielectric material include a layer of lead enhanced perovskite material with average grain size less than the original critical grain size formed on the surface of a substrate. Other structures include such a layer of lead enhanced perovskite material interposed between two electrically conducting layers.

The applications of this invention are many. The materials presented may find use in many structures used in semiconductor circuitry, such as capacitors, MOS transistors, pixels for electro-magnetic radiation detecting arrays, and electrooptic applications. Devices which exploit the piezoelectric properties of many of these materals will benefit from this invention.

The advantages of this invention include substantially increased dielectric constants for perovskite materials formed with grain sizes typically found in thin films. In addition, the resistivity is generally increased and the loss tangent is generally decreased by the methods presented. The invention also provides for improved uniformity of the dielectric constant with respect to temperature for perovskite materials in thin film form.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings.

In the drawings.

DETAILED DESCRIPTION OF THE PREFERRED EMBODIMENT

Figure 1:
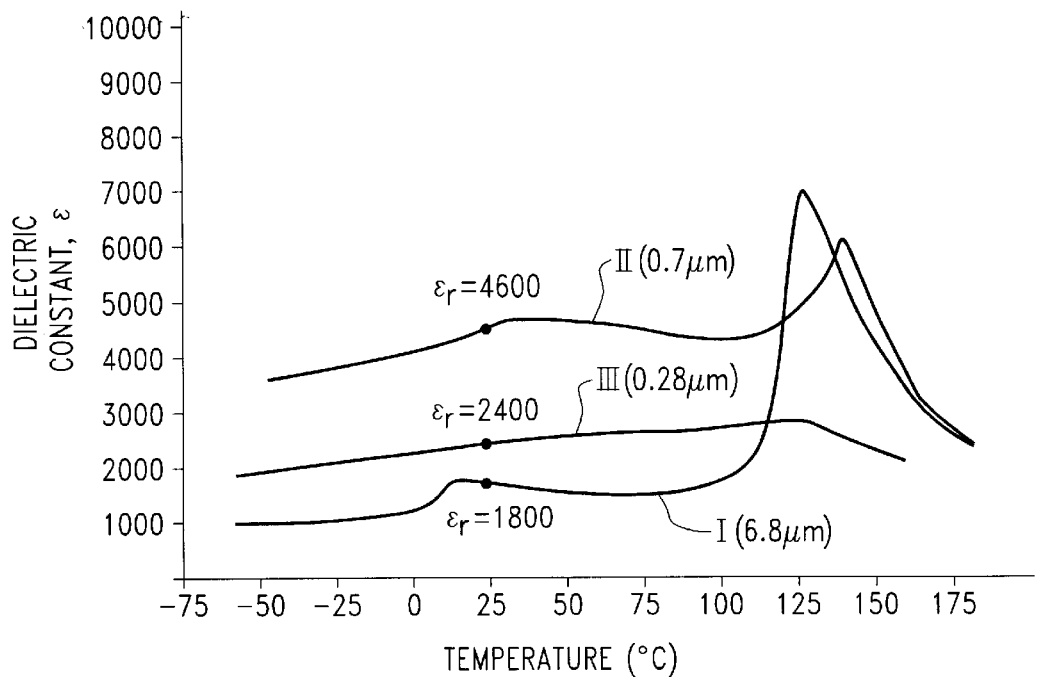
FIG. 1 is a graph showing the variation of dielectric constant versus temperature for barium titanate of various grain sizes.

As shown in FIG. 1, the dielectric constant of undoped barium titanate (BT) varies with temperature and grain size. For a grain size of 6.8 $\mu$m, the dielectric constant has a sharp peak at the Curie temperature, but is much less at other temperatures. As the grain size is decreased to 0.7 $\mu$m, the peak becomes less pronounced, the dielectric constant below the Curie temperature increases and varies less with temperature. At still smaller grain sizes, the dielectric constant decreases for all temperatures.

Figure 2:
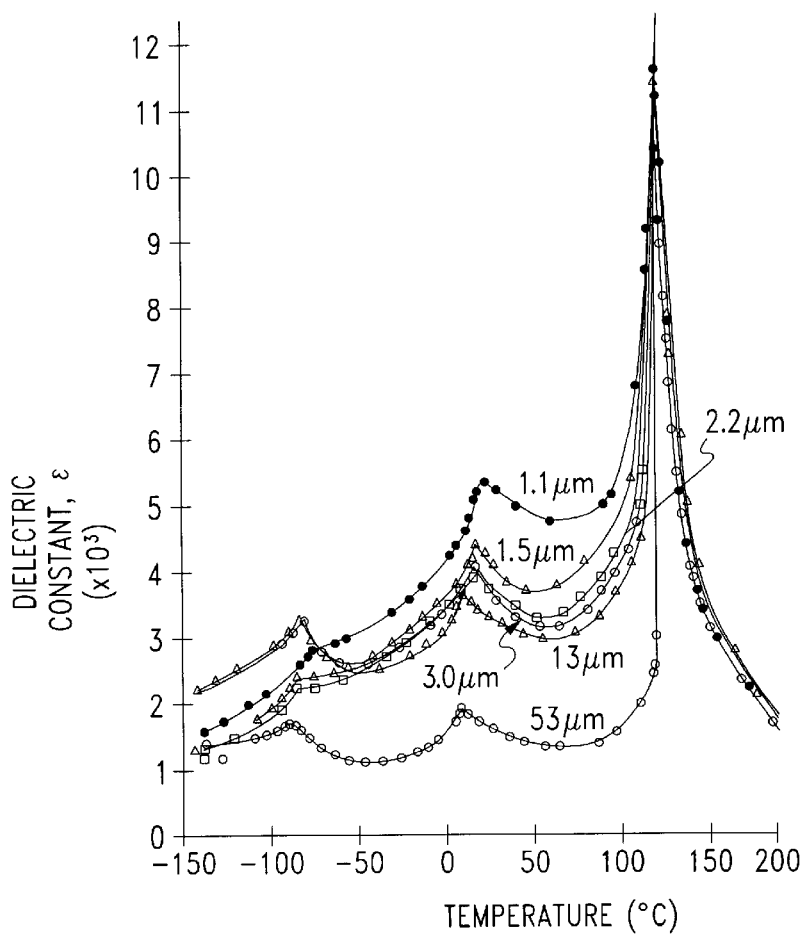
FIG. 2 is a graph showing the variation of dielectric constant versus temperature for barium titanate of various grain sizes.

Referring to FIG. 2, the same trend can be seen. At large grain sizes (i.e. 53 $\mu$m), the dielectric constant has a pronounced peak at the Curie temperature. As the grain size decreases, the dielectric constant below the Curie temperature increases. At 1.1 $\mu$m, for example, the dielectric constant is approximately three times higher at temperatures between 0° C. and Curie temperature.

Figure 3:
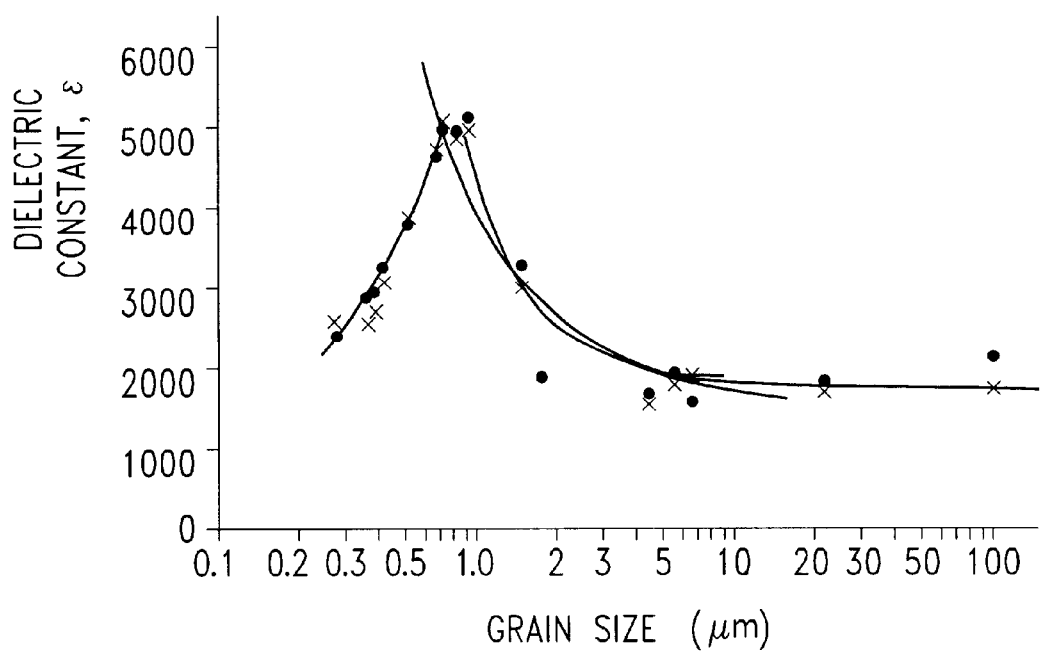
FIG. 3 is a graph showing the variation of dielectric constant versus grain size for barium titanate.
Figure 4:
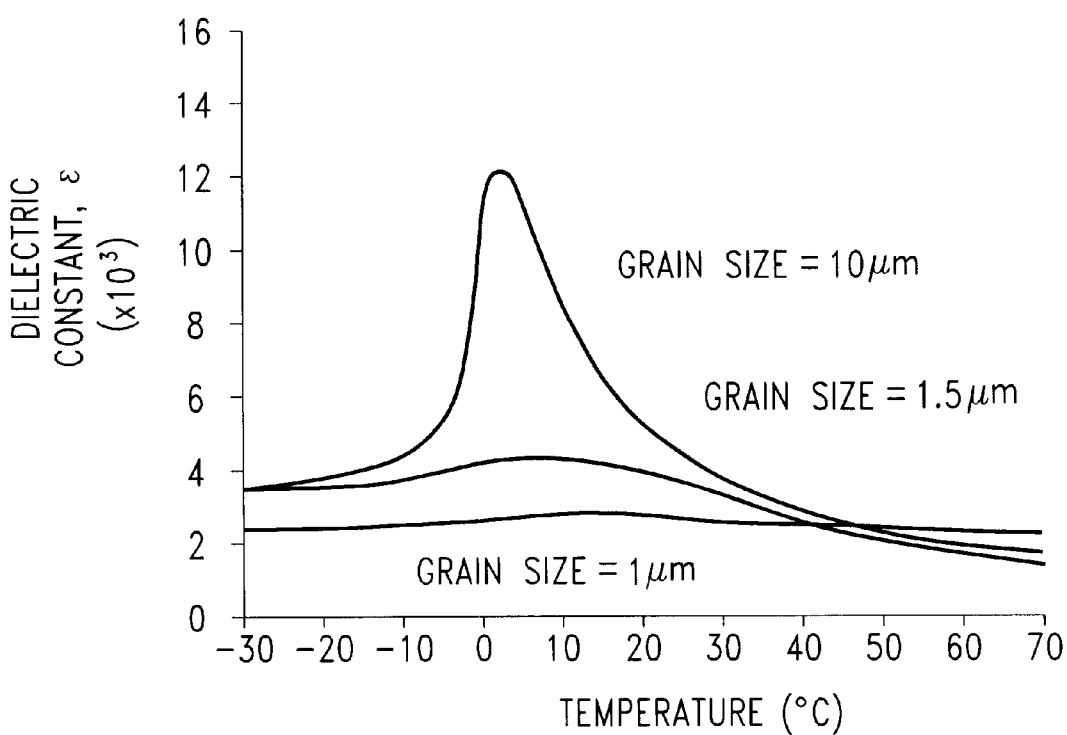
FIG. 4 is a graph showing the variation of dielectric constant versus temperature for barium strontium titanate at various grain sizes.

Referring to FIG. 3, it is seen that there is a grain size at which the dielectric constant below the Curie temperature is at a maximum. FIG. 3 shows measurements of the dielectric constant of barium titanate at both 25° C. and 70° C. (both of which are below the Curie temperature for that material). Again, the critical grain size, as used herein, means the largest grain size such that the dielectric constant decreases with decreasing grain sizes when measured at the intended operating temperature. The critical grain size for barium titanate is approximately 0.7 $\mu$m according to the data represented by FIG. 3.

Past efforts in this field have attempted to maximize the dielectric constant of thin films by forming the films in a way that causes the grain size to approach the critical grain size. The instant invention increases the thin film dielectric constant by reducing the critical grain size. Any technique which decreases the critical grain size will improve the dielectric constant at still smaller grain sizes for temperatures below the Curie temperature.

It has been found that lead generally decreases the critical grain size of perovskite materials. Lead may be added to a perovskite material which contains essentially no lead. Alternately, lead may be added to a perovskite material which initially contains some lead. In either case, the critical grain size of the lead enhanced material is less than the critical grain size of the original material.

It has also been found that acceptor dopants increase the resistivity of lead enhanced perovskite materials. It has also been found that acceptor dopants decrease the loss tangent of lead enhanced perovskite materials. Therefore, another aspect of this invention is acceptor co-doping of lead enhanced perovskite materials. Generally, an element or ion is an acceptor dopant if (1) it replaces an atom in the crystal lattice and has a lesser number of valence electrons than the atom it replaces or (2) it exists interstitially and its outer electron shell is more than half full. Intermediate cases are uncertain and may be determined empirically. For example, some elements behave as acceptor dopants in (1) when their valence is the same as the atom replaced. Likewise, in (2) some elements behave as acceptor dopants when their valence shell is exactly half full.

A dopant is a species which is intentionally introduced into an intrinsic material in order to produce some effect. Unintentional impurities which exist in concentrations below approximately 0.1 mole percent are not generally considered dopants. Accordingly, in the context of this invention, an intrinsic perovskite material is a perovskite material in which impurities which behave as donor or acceptor dopants, if present, exist at concentrations below approximately 0.1 mole percent. Similarly, an intrinsic critical grain size is the critical grain size of an intrinsic perovskite material.

In a preferred embodiment of this invention, material with the nominal composition $$(Sr_{0.65},Pb_{0.35})TiO_3$$

is prepared by combining constituents in a solution, then calcining the solution in bulk. The bulk ceramic is then ground, pressed, and sintered to produce a ceramic with density at least 95% of theoretical density.

To measure the properties of the preferred embodiement material, the ceramic is mechanically polished and thinned to 10 mil thickness. Metallization is applied to form test capacitors.

The average grain size of the material produced was 0.8 µm as measured by the line intercept method. The peak dielectric constant (the dielectric constant at the Curie temperature) was greater than 10,000, and varied rapidly with respect to temperature. This behavior indicates that the critical grain size of this material is less than 0.8 µm.

A preferred embodiment has been described in detail hereinabove. It is to be understood that the scope of the invention also comprehends embodiments different from that described, yet within the scope of the claims. Internal and external connections to devices fabricated with this improved dielectric material may be ohmic, capacitive, direct or indirect, via intervening circuits or otherwise. Implementation is contemplated in discrete components or fully integrated circuits in silicon, gallium arsenide, or other electronic materials families.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of forming a dielectric thin film on a substrate, said method comprising:

combining lead and the constituents of barium and/or strontium titanate in a common solution;

calcining said common solution to form the constituents of barium and/or strontium lead titanate;

depositing said constituents of barium and/or strontium lead titanate on said substrate, thereby forming said thin film having an average grain size between 0.02 and 0.2 µm.

2. The method of claim 1, wherein the molar ratio of said lead to said titanium in said thin film is less than or equal to 0.35.

3. The method of claim 1, wherein said constituents further comprise at least one acceptor dopant.

4. The method of claim 1, wherein said thin film has a composition $(Sr_{0.65}Pb_{0.35})TiO_3$.

* * * * *